(12) United States Patent
Terzioglu et al.

(10) Patent No.: US 6,816,412 B2
(45) Date of Patent: Nov. 9, 2004

(54) NON-VOLATILE MEMORY CELL TECHNIQUES

(75) Inventors: Esin Terzioglu, Aliso Viejo, CA (US); Morteza Cyrus Afghahi, Mission Viejo, CA (US); Gil I. Winograd, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 207 days.

(21) Appl. No.: 10/151,981

(22) Filed: May 21, 2002

(65) Prior Publication Data

US 2003/0218909 A1 Nov. 27, 2003

(51) Int. Cl.$^7$ ............................ G11C 16/04; G11C 16/06
(52) U.S. Cl. ............................ 365/185.18; 365/185.27; 365/185.28; 365/185.29
(58) Field of Search ..................... 365/185.18, 185.27, 365/185.28, 185.29

(56) References Cited

U.S. PATENT DOCUMENTS

| | | | | |
|---|---|---|---|---|
| 4,884,239 | A | * 11/1989 | Ono et al. ............. | 365/185.18 |
| 5,818,761 | A | * 10/1998 | Onakado et al. ....... | 365/185.18 |
| 6,215,148 | B1 | 4/2001 | Eitan | |
| 6,266,278 | B1 | * 7/2001 | Harari et al. .......... | 365/185.29 |
| 6,631,088 | B2 | * 10/2003 | Ogura et al. .......... | 365/185.18 |
| 6,687,164 | B2 | * 2/2004 | Matsuda et al. ....... | 365/185.29 |

OTHER PUBLICATIONS

Korotkov et al., *Resonant Fowler–Nordheim Tunneling through Layered Tunnel Barriers and its Possible Applications*, Techn. Dig. IDEM '99, pp. 223–226, State University of New York, USA.

Shukuri et al., *CMOS Process Compatible ie–Flash (inverse gate electrode Flash) Technology for System–on–a Chip*, IEEE 2001 Custom Integrated Circuits Conference, pp. 179–182, Central Research Laboratory, Hitachi Ltd., Japan.

Ohsaki et al., *A Single Poly EEPROM Cell Structure for Use in Standard CMOS Processes*, IEEE Journal of Solid–State Circuits, vol. 29, No. 3. Mar. 1994, pp. 311–316, Japan.

McPartland et al., *1.25 Volt, Low Cost, Embedded FLASH Memory for Low Density Applications*, 2000 Symposium on VLSI Circuits Digest of Technical Papers, pp. 158–161, Bell Laboratories, Lucent Technologies, USA.

Carman et al., *Single Poly EEPROM for Smart Power IC's*, ISPSO 2000, May 22–25, 2000 IEEE, pp. 177–179, France.

CHI et al., *A New Single–poly Flash Memory Cell with Low–voltage and Low–power Operations for Embedded Applications*, MS E140, Advanced Technology Group, National Semiconductor Cor., pp. 126–127, USA.

* cited by examiner

Primary Examiner—Trong Phan
(74) Attorney, Agent, or Firm—McAndrews, Held & Malloy, Ltd.

(57) ABSTRACT

A non-volatile memory cell (10) includes a charge-storing node (16). An electrically insulating first layer (76) is coupled between the node and a source of a first voltage (22). An electrically insulating second layer (66) is coupled between the node and a source of a second voltage (20–21). The area of the first layer is smaller than the area of the second layer. A controller (90) is arranged to cause the first voltage to be greater than the second voltage so that charge is extracted from the node and is arranged to cause the second voltage to be greater than the first voltage so that charge is injected into the node.

18 Claims, 4 Drawing Sheets

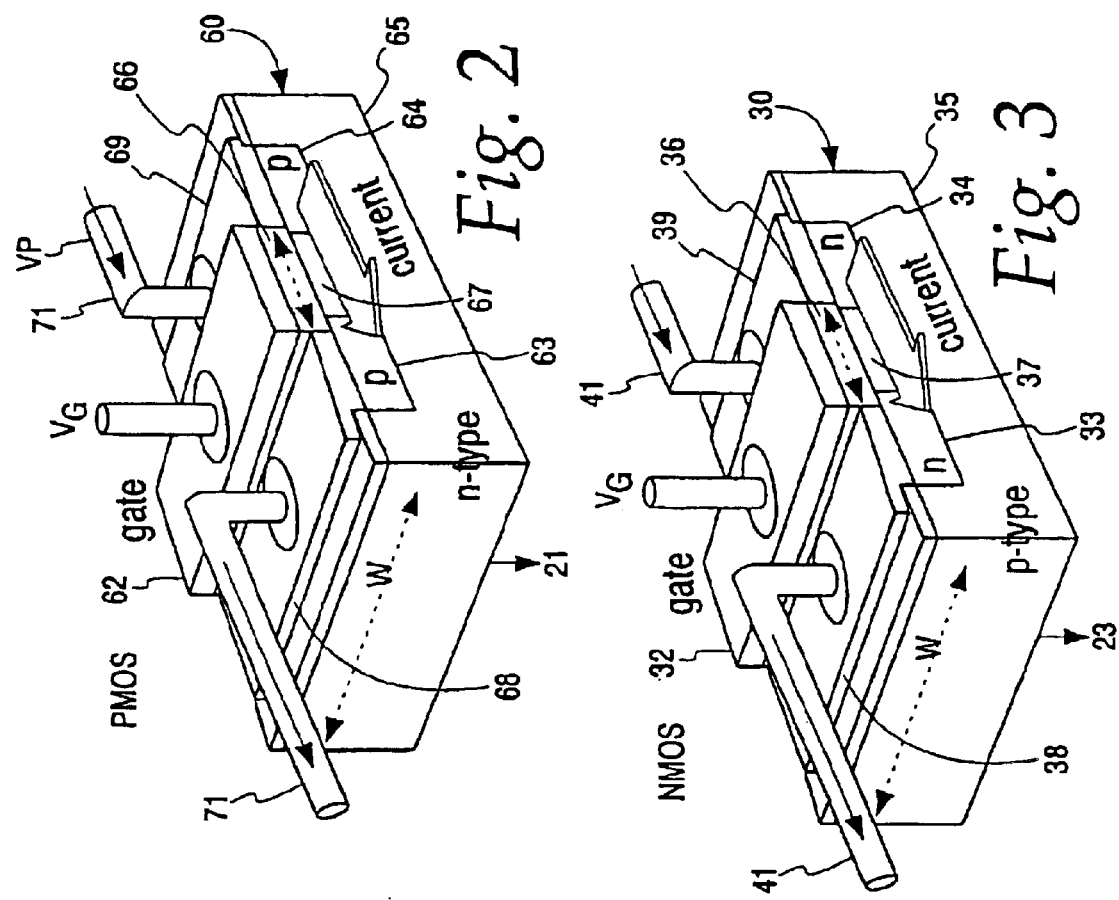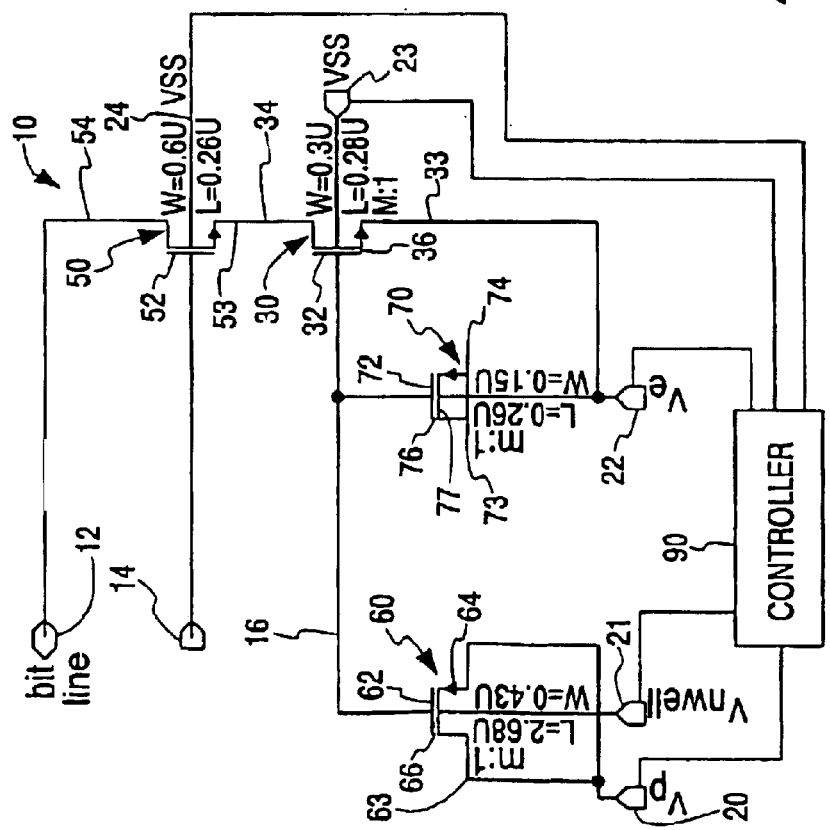

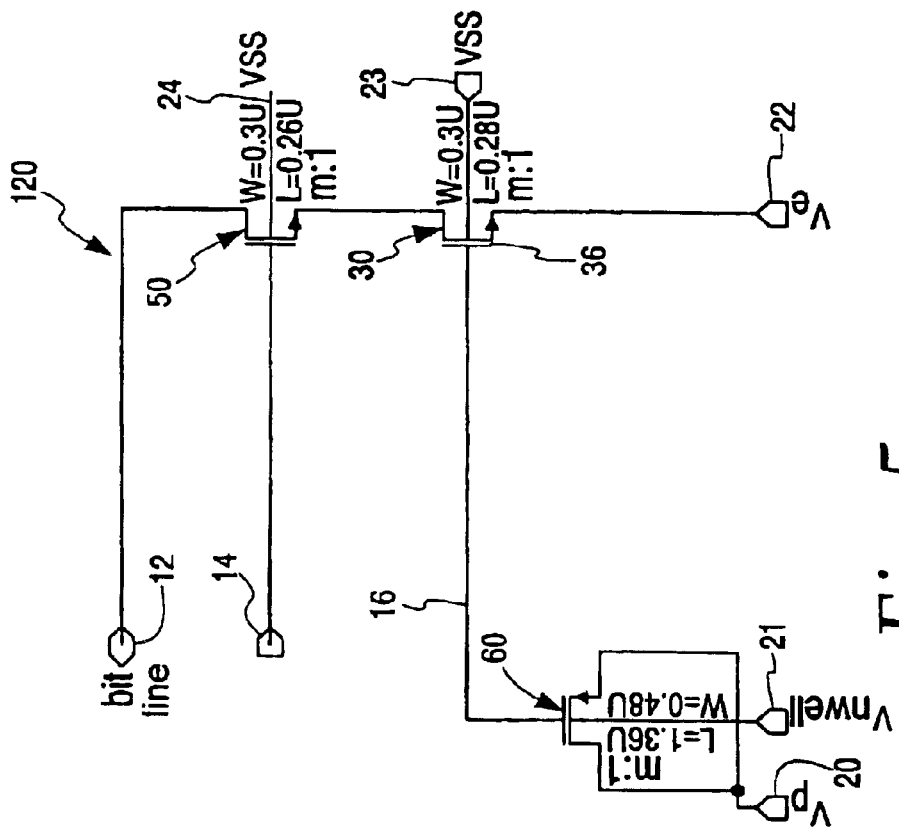
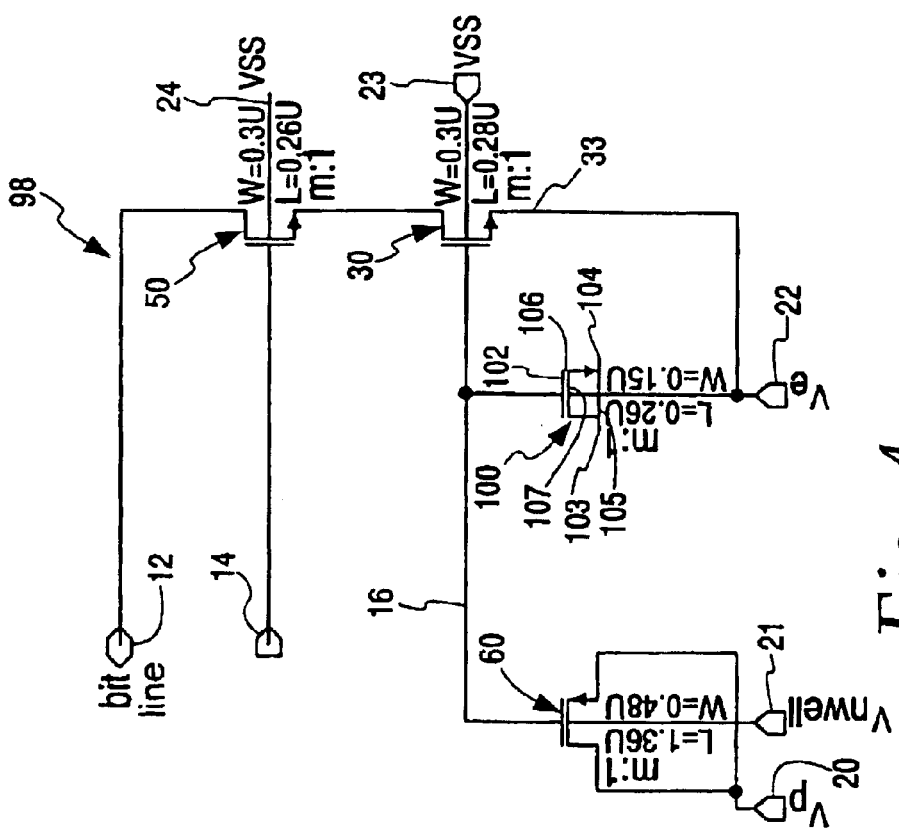

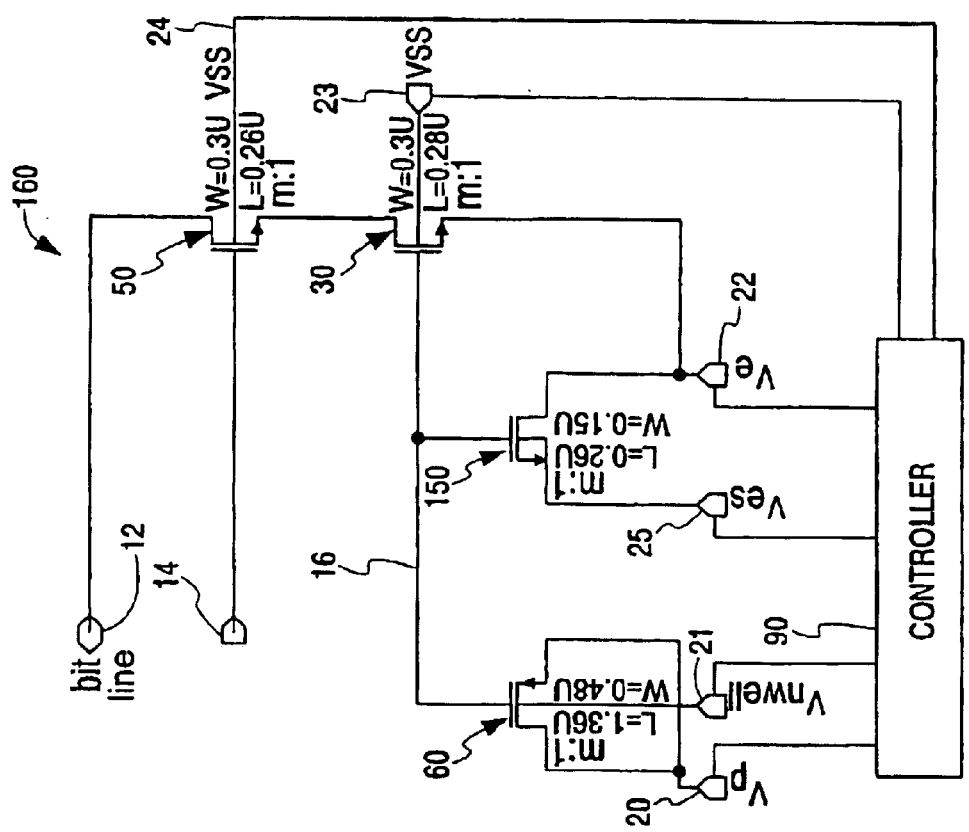
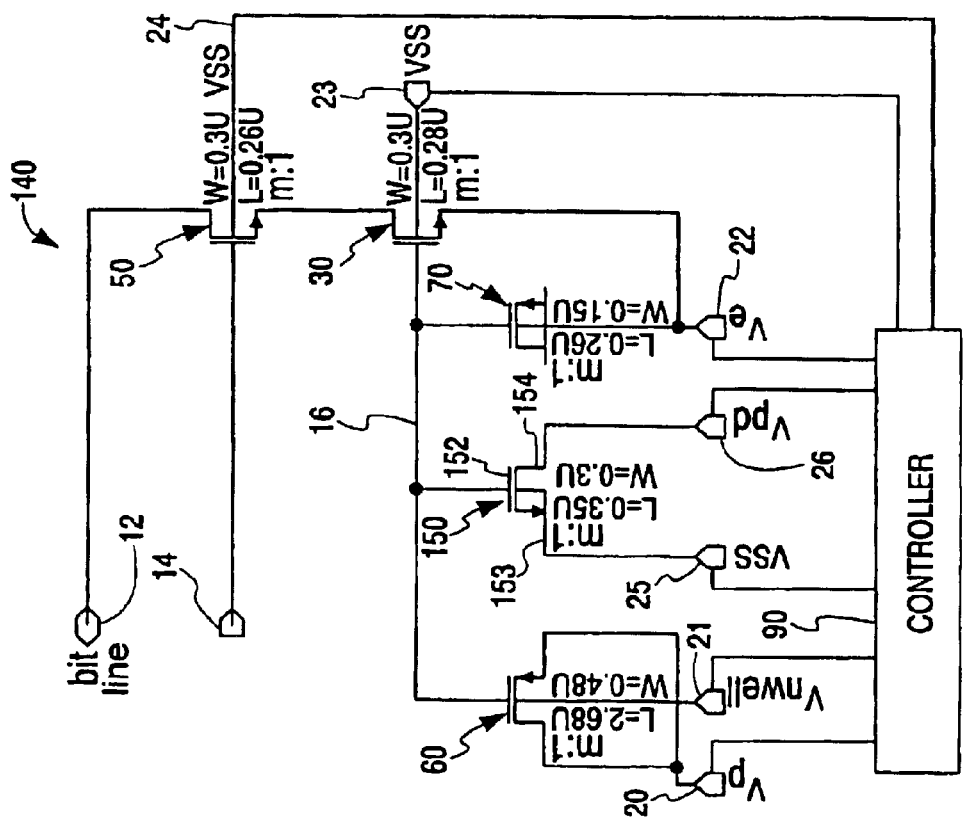
Fig. 6
Fig. 7

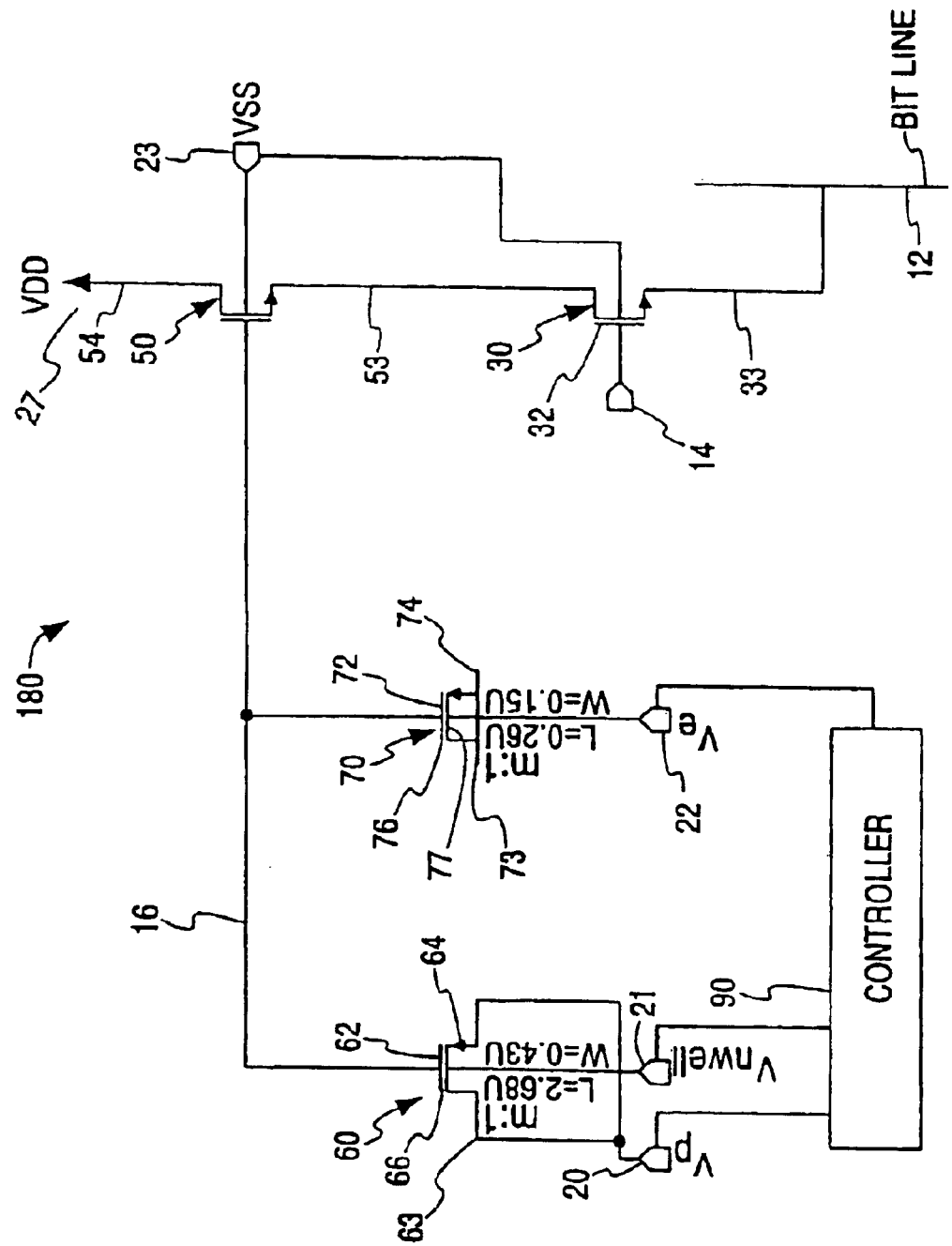

NON-VOLATILE MEMORY CELL TECHNIQUES

BACKGROUND OF THE INVENTION

This invention relates to memory cells and more particularly relates to non-volatile memory cells.

Non-volatile memory cells maintain their contents without the need for an external power supply. In comparison, SRAM, DRAM or other memory technologies lose their contents when the power is switched off. An internal battery is sometimes used to mimic non-volatile memory with SRAM or DRAM; however, an internal battery installation is expensive and cannot guarantee proper operation over long periods of time. It is highly desirable to store certain data, such as boot-up code, chip ID, chip self-repair information, etc., in a non-volatile memory.

The application of non-volatile memory in the price-competitive application specific integrated circuit (ASIC) market has been limited due to the complex processes required to fabricate these memories. Non-volatile memory fabrication requires numerous extra mask layers and fabrication steps, which increase cost and decrease yields. High cost and complex processing has been a barrier for using embedded non-volatile memory in the ASIC market. The information typically is stored on a floating storage polysilicon node. The floating node potential is controlled by a second polysilicon gate coupled to the storage polysilicon gate. A majority of the extra cost for non-volatile memories is incurred in achieving this double polysilicon structure separated by a thin oxide layer.

Non-volatile memory needed on ASIC's has been provided on a circuit board as a separate chip which is manufactured by specialized fabrication processes. The availability of non-volatile memory in standard generic digital CMOS processes would cut board-level cost and open up a range of new embedded applications.

U.S. Pat. No. 6,215,148 (the "'148 patent") describes a non-volatile memory cell that avoids double polysilicon gate structure. However, the '148 patent structure creates other problems described at Col. 2, lines 36–45. The '148 patent also describes an attempt to avoid the problems by increasing the complexity of the cell as shown in FIGS. 4A and 4B. These problems are overcome by the embodiments described in this specification.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

According to an apparatus embodiment of the invention, a non-volatile memory cell comprises a node arranged to store charge. An electrically insulating first layer is coupled between the node and a source of a first voltage. An electrically insulating second layer is coupled between the node and a source of a second voltage, and the area of the first layer being smaller than the area of the second layer. A controller is arranged to cause the first voltage to be greater than the second voltage so that charge is extracted from the node and arranged to cause the second voltage to be greater than the first voltage so that charge is injected into the node.

One method embodiment of the invention is useful in a non-volatile memory cell comprising a node arranged to store charge that generates a node voltage. In such an environment, charge on the node is adjusted by a method comprising capacitive coupling a first voltage to the node and capacitive coupling a second voltage less than the first voltage to the node, the capacitive coupling of the first voltage being less than the capacitive coupling of the second voltage so that charge is extracted from the node. The method also comprises capacitive coupling a third voltage to the node and capacitive coupling a fourth voltage to the node greater than the third voltage, the capacitive coupling of the third voltage being less than the capacitive coupling of the fourth voltage so that charge is injected into the node.

By using the foregoing techniques, charge may be adjusted in a non-volatile memory with a degree of economy, ease of fabrication and reliability previously unattained.

These and other advantages and novel features of the present invention, as well as details of an illustrated embodiment thereof, will be more fully understood from the following description and drawings.

BRIEF DESCRIPTION OF THE DRAWING

FIG. 1 is a schematic diagram of a first embodiment of the invention employing PMOS and NMOS transistors.

FIG. 2 is a schematic diagram of the PMOS transistors shown in FIG. 1.

FIG. 3 is a schematic diagram of the NMOS transistors shown in FIG. 1.

FIG. 4 is a schematic diagram of a second embodiment of the invention employing a single PMOS transistor.

FIG. 5 is a schematic diagram of a third embodiment of the invention in which one of the transistors shown in FIG. 4 is eliminated.

FIG. 6 is a schematic diagram of a fourth embodiment of the invention employing hot electron injection for charge injection.

FIG. 7 is a schematic diagram of a fifth embodiment of the invention employing hot electron injection for charge erasing and charge injection.

FIG. 8 is a schematic diagram of a sixth embodiment of the invention in which a pair of transistor is switched in position relative to the FIG. 1 embodiment.

DETAILED DESCRIPTION OF THE INVENTION

This specification describes several techniques of achieving non-volatile memory cells that can be made with standard generic digital CMOS fabrication processes. There are no extra fabrication masks or steps required.

Referring to FIG. 1, a first embodiment of the invention takes the form of a non-volatile memory cell 10 that is coupled to a bit line 12 and a word line 14. The cell includes a node 16 that comprises a conductive material, such as metal or polysilicon, as well as various sources of reference voltages 20–24.

Referring to FIGS. 1 and 3, an NMOS field effect transistor 30 comprises a gate 32, a source 33, a drain 34, a substrate 35 and an electrically insulating oxide layer 36 that is capacitively coupled between node 16 and a voltage source 22. The source and drain are n type material and the substrate is p type material. The source and drain are separated by a channel region 37. Electrodes 38 and 39 connect the source and drain in a current path 41 that extends from bit line 12 to voltage source 22. Substrate 35 is connected to a voltage source 23. Source 33 is connected to a source of voltage 22.

Another NMOS field effect transistor 50 is constructed like transistor 30. Transistor 50 includes a gate 52 that is connected to word line 14, a drain 54 that is connected to bit line 12 and a source 53 that is connected to drain 34. Source 53 and drain 54 are connected in path 41.

Referring to FIGS. 1 and 2, a PMOS transistor 60 includes a gate 62 connected to node 16, a source 63, a drain 64, a substrate 65 and an electrically insulating oxide layer 66 that is capacitively coupled between node 16 and voltage sources 20–21. The source and drain are p type material and the substrate is n type material. The source and drain are separated by a channel region 67. Electrodes 68 and 69 connect the source and drain in a current path 71. Voltage source 20 is connected to the source and drain, and voltage source 21 is connected to substrate 65.

Another PMOS field effect transistor 70 is constructed like transistor 60. Transistor 70 includes a gate 72 that is connected to node 16, and includes a source 73, and a drain 74 that are connected to voltage source 22. A channel region 77 separates the source and drain. An electrically insulating tunneling oxide layer 76 is located under gate 72 and is capacitively coupled between node 16 and voltage source 22. The area of layer 76 is smaller than the area of layer 66. Typically, the area of layer 76 is 5% or less of the area of layer 66. In addition, the surface area of transistor 70 (i.e., the surface area of the source, drain and channel) is smaller than the surface area of transistor 60 (i.e., the surface area of the source, drain and channel). Typically, the surface area of transistor 70 is 5% or less of the surface area of transistor 60.

The sources, drains, channel areas and substrates of each of transistors 30, 50, 60 and 60 70 are fabricated from semiconductor materials.

For the cells shown in FIGS. 1 and 4–7, planar structures are used to couple to the charge storage node 16. Taking advantage of advanced fabrication processes, field assisted tunneling is used to modulate the charge stored on node 16. For the cells shown in FIGS. 6 and 7, hot electron injection is used to modulate the charge stored on node 16. Beside each of the transistors shown in FIGS. 1 and 4–8, the length of the transistor is indicated by L, the width of the transistor is indicated by W, and the multiple of the transistor is indicated by m. The letter U indicates a micron.

Still referring to FIG. 1, node 16 is a floating charge storage node whose potential is varied by modulating the charge stored on node 16. Transistor 60 is a large PMOS device that is used to modify the potential at node 16 by capacitive coupling.

A conventional controller 90 determines the voltage of sources 20–24 during various modes of operation. During an erase operation that removes charge from node 16, electrons are extracted from node 16 by raising terminal 22 to a high voltage. Transistor 70 is small relative to transistor 60, and transistor 70 therefore forms a small portion of the capacitance at node 16 (e.g., the capacitance of node 16 supplied by transistor 70 is much smaller than the capacitance of node 16 supplied by transistor 60). Therefore, most of the applied source 22 voltage is dropped across the oxide layer 76 of transistor 70. Electron extraction from node 16 is achieved when the high positive potential at source 22 attracts electrons from node 16 and causes them to tunnel through oxide layer 76. During an erase operation, controller 90 typically causes the voltages of sources 20–24 to be switched to the following values: Vp, source 20, is approximately 0 volts; Vnwell, source 21, is tied to Vp, source 20; Ve, source 22, is approximately 4 volts; and VSS, nodes 23–24, are approximately 0 volts.

Electrons are injected into floating node 16 during a programming operation by raising terminals 20–21 to a high voltage. Terminals 20–21 can be tied together in a typical cell. Since transistor 60 forms the majority of the capacitance at node 16, only a small amount of the applied source 20–21 voltage is dropped across the oxide layer 66 of transistor 60. In other words, the percentage of source 20–21 voltage dropped across layer 66 is much lower than the percentage of source 22 voltage dropped across layer 76. As a result, due to the operation of transistor 60, the potential of node 16 rises significantly when high voltage is applied from sources 20–21. Since the voltage of source 22 is kept at zero potential during a programming operation, a large potential develops across the oxide layer 76 in the opposite direction of the erase operation. The large voltage across layer 76 attracts electrons into the floating node by a field assisted tunneling mechanism.

Cells like cell 10 typically are organized in an array of cells. For the cells in such a memory array that are not to be programmed, the voltage sources like source 22 are biased to half the source 22 program voltage so as not to cause any disturbance. During a programming operation, controller 90 typically causes the voltages of sources 20–24 to be switched to the following values: Vp, source 20, is approximately 4 volts; Vnwell, source 21, is tied to Vp, source 20; Ve, source 22, is approximately 0 volts; and VSS, nodes 23–24 are approximately 0 volts. If no program is desired for the cell, then Ve, source 22, is approximately 2 volts.

Still referring to FIG. 1, transistors 30 and 50 are used to read data from cell 10. Erase and programming operations require large voltages in the range of 4 volts, and they result in threshold shift and device performance degradation over time. The read operation is accomplished by raising the voltage of word line 14, and the voltages of sources 20–21 to typical chip voltages, such as approximately 1.2 volts in 0.13 micrometer technology. If the potential of node 16 is high enough (e.g., when cell 10 is erased), transistor 30 is switched on. If transistor 50 also is switched on, a current flow in path 41 causes the potential of bit line 12 to decrease. If the potential of node 16 is low (e.g., cell 10 is programmed and net negative charge is present on node 16), transistor 30 is not switched on, and no current flows in path 41 so that the voltage on bit line 12 remains high.

An alternative embodiment of the cell shown in FIG. 1 is to switch the order of transistors 30 and 50. The source of transistor 30 is exposed to high voltage during an erase operation, which can cause some device characteristics to shift over time. By moving transistor 30 to the position of transistor 50, and connecting the source of transistor 50 to ground, this damage can be minimized.

The embodiment of FIG. 1 uses two PMOS transistors 60 and 70 that require two separate n wells 65 and 75 that need to be independently controlled. As shown in FIG. 4, in a cell 98, PMOS transistor 70 can be replaced with an NMOS transistor 100 that is constructed like transistor 30 shown in FIG. 3. Transistor 100 includes a gate 102 that is connected to node 16 and a source 103 and a drain 104 that are connected to voltage source 22. Transistor 100 also includes a substrate 105 that is connected to VSS, source 23, unless a deep Nwell is used, which takes more area. A channel region 107 separates the source and drain. An electrically insulating tunneling oxide layer 106 is located under gate 102 and is capacitively coupled between node 16 and voltage source 22. The area of layer 106 is smaller than the area of layer 66. Typically, the area of layer 106 is about 5% or less of the area of layer 66. In addition, the surface area of transistor 100 (i.e., the surface area of the source, drain and channel) is smaller than the surface area of transistor 60 (i.e., the surface area of the source, drain and channel). Typically, the surface area of transistor 100 is 5% or less of the surface area of transistor 60.

Aside from the replacement of transistor 70 with transistor 100, cell 98 is identical to cell 10 and operates in the same manner described in connection with cell 10. Transistors 30, 50, 60 and 100 are connected to controller 90 is the same manner shown in FIG. 1.

Source 33 of transistor 30 is involved in the tunneling process described in connection with FIG. 4. At the expense of having more charge pass through oxide layer 36 of transistor 30, tunneling transistor 100 can be removed to form a compact cell 120 shown in FIG. 5. Cell 120 is identical to cell 98, except that transistor 100 has been removed. Transistors 30, 50 and 60 are connected to controller 90 in the same manner shown in FIG. 1.

In the embodiment shown in FIG. 5, layer 36 is an electrically insulating tunneling oxide layer located under gate 32 and is capacitively coupled between node 16 and voltage source 22. The area of layer 36 is smaller than the area of layer 66. Typically, the area of layer 36 is about 5% or less of the area of layer 66. In addition, the surface area of transistor 30 (i.e., the surface area of the source, drain and channel) is smaller than the surface area of transistor 60 (i.e., the surface area of the source, drain and channel). Typically, the surface area of transistor 30 is 5% or less of the surface area of transistor 60.

The embodiment of FIG. 5 operates in the same manner as the embodiment of FIG. 1, except that the tunneling mechanism for erasing and programming node 16 is carried out by transistor 30, rather than by transistor 70.

If programming speed is too slow with the electric field assisted tunneling described in connection with FIGS. 1, 4 and 5, channel hot electron (CHE) programming may be used in a cell 140 shown in FIG. 6. Cell 140 is identical to cell 10, except that an NMOS field effect transistor 150 is added to cell 140. Transistor 150 includes a gate 152, a source 153 connected to a source of voltage 25 and a drain 154 connected to a source of voltage 26. Transistor 70 is used to remove electrons from node 16 during the erase operation in the manner described in connection with FIG. 1. Transistor 60 is used to capacitively couple to node 16 and to bias gate 152. When a drain voltage is applied to transistor 150 through sources 25 and 26 and controller 90, hot electrons are injected into node 16 under appropriate bias conditions through program operation of controller 90. The bias conditions are known to those skilled in hot electron injection.

Cell 140 has two PMOS transistors 60 and 70 with separate n wells 65 and 75. Transistor 70, used for the erase operation, can be eliminated to shrink the cell size as shown in cell 160 illustrated in FIG. 7. The hot electron injection transistor 150 is used for both an erase operation that removes charge from node 16 and a programming operation that injects charge into node 16. During the erase operation, controller 90 typically provides voltages in the range of 4 volts from sources 20, 21, 22, 23, 24 and 25. During the programming operation, controller 90 typically provides voltages in the range of 4 volts from sources 20, 21, 22, 23, 24 and 25.

During the erase operation, controller 90 biases sources 22 and 25 to relatively high voltages. The voltages on sources 22 and 25 cause charge to be extracted from node 16.

During the programming operation that injects charge to node 16, transistor 150 operates in the manner described in connection with FIG. 6.

Another embodiment of the invention, illustrated in FIG. 8, reverses the order of transistors 30 and 50 as shown in a cell 180. Bit line 12 is connected to source 33 of transistor 30, and drain 54 is connected to a VDD source of voltage 27. The gate 32 of transistor 30 is connected to the word line 14. Otherwise, the FIG. 8 embodiment is like the FIG. 1 embodiment. The embodiment of FIG. 8 helps to ensure transistors 30 and 50 will not be subjected to excessive voltage stress, so that reliability is increased. In the FIG. 8 embodiment, controller 90 operates that same as described in connection with the FIG. 1 embodiment, except that during an erase operation, controller 90 causes the Ve voltage to be switched to the range of values 3–5 volts, and during a programming operation, controller 90 causes the Vp voltage to be switched to the range of 3–5 volts.

The principles of the FIG. 8 embodiment also can be applied to the embodiments shown in FIGS. 4–7. More specifically, the position of transistors 30 and 50 in FIGS. 4–7 may be reversed as in FIG. 8.

While the invention has been described with reference to one or more preferred embodiments, those skilled in the art will understand that changes may be made and equivalents may be substituted without departing from the scope of the invention. For example, transistors 30 and 50 may be interchanged as shown in FIG. 8. In FIGS. 6 and 7, source 153 of NMOS transistor 150 may be grounded to minimize high field damage to read transistors 30 and 50. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. A non-volatile memory cell comprising:
   a node arranged to store charge;
   an electrically insulating first layer coupled between the node and a source of a first voltage;
   an electrically insulating second layer coupled between the node and a source of a second voltage, the area of the first layer being smaller than the area of the second layer; and
   a controller arranged to cause the first voltage to be greater than the second voltage so that charge is extracted from the node and arranged to cause the second voltage to be greater than the first voltage so that charge is injected into the node.

2. The cell of claim 1 wherein the charge is extracted and injected by tunneling through the first layer.

3. The cell of claim 1 wherein the first layer comprises a first oxide layer and wherein the second layer comprises a second oxide layer.

4. The cell of claim 3 wherein the first oxide layer comprises a tunneling oxide layer.

5. The cell of claim 1 wherein the first layer is coupled to the node through first semiconductor material.

6. The cell of claim 5 wherein the second layer is coupled to the node through second semiconductor material.

7. The cell of claim 6 wherein the cell comprises a bit line, wherein the node charge generates a node voltage, wherein the first layer forms a portion of a first transistor comprising a gate biased by the node voltage and comprising a path between the bit line and the first voltage.

8. The cell of claim 7 wherein the cell comprises a word line and further comprises a second transistor connected in the path and having a conductive state controlled by a voltage on the word line.

9. The cell of claim 6 wherein the first semiconductor material comprises a first transistor and wherein the second semiconductor material comprises a second transistor larger than the first transistor.

10. The cell of claim 9 wherein the first transistor and second transistor each comprises a PMOS field effect transistor.

11. The cell of claim 9 wherein the first transistor comprises an NMOS field effect transistor and wherein the second transistor comprises a PMOS field effect transistor.

12. The cell of claim 11 wherein the NMOS field effect transistor is arranged to provide channel hot electron injection of charge to the node and channel hot electron extraction from the node.

13. The cell of claim 10 and further comprising a third NMOS field effect transistor arranged to inject charge into the node by channel hot electron injection.

14. The cell of claim 9 wherein the charge of the node generates a node voltage, wherein the cell comprises a bit line and further comprising a third transistor having a conductive state controlled by the node voltage and forming a path between the bit line and the source of first voltage.

15. The cell of claim 14 wherein the cell comprises a word line and further comprising a fourth transistor connected in the path and having a conductive state controlled by a voltage on the word line.

16. The cell of claim 1 wherein the first layer and second layer are CMOS generic fabricated planar layers.

17. In a non-volatile memory cell comprising a node arranged to store charge that generates a node voltage, a method of adjusting the charge on the node comprising:

capacitive coupling a first voltage to the node and capacitive coupling a second voltage less than the first voltage to the node, the capacitive coupling of the first voltage being less than the capacitive coupling of the second voltage so that charge is extracted from the node; and capacitive coupling a third voltage to the node and capacitive coupling a fourth voltage to the node greater than the third voltage, the capacitive coupling of the third voltage being less than the capacitive coupling of the fourth voltage so that charge is injected into the node.

18. The method of claim 17 wherein the charge is extracted from the node by tunneling and wherein the charge is injected to the node by tunneling.

* * * * *